US012581610B2

(12) United States Patent
Moreliere

(10) Patent No.: US 12,581,610 B2
(45) Date of Patent: Mar. 17, 2026

(54) MODULAR ELECTRONIC ASSEMBLY

(71) Applicant: OPENINDUS, Toulouse (FR)

(72) Inventor: David Moreliere, Toulouse (FR)

(73) Assignee: OPENINDUS, Toulouse (FR)

( * ) Notice: Subject to any disclaimer, the term of this patent is extended or adjusted under 35 U.S.C. 154(b) by 108 days.

(21) Appl. No.: 18/557,202

(22) PCT Filed: Apr. 27, 2022

(86) PCT No.: PCT/EP2022/061191
§ 371 (c)(1),
(2) Date: Oct. 25, 2023

(87) PCT Pub. No.: WO2022/229255
PCT Pub. Date: Nov. 3, 2022

(65) Prior Publication Data
US 2024/0244784 A1     Jul. 18, 2024

(30) Foreign Application Priority Data

Apr. 28, 2021    (FR) ..................................... 2104432

(51) Int. Cl.
H05K 7/14         (2006.01)
(52) U.S. Cl.
CPC ......... H05K 7/1474 (2013.01); H05K 7/1465 (2013.01); H05K 7/1477 (2013.01)
(58) Field of Classification Search
CPC ... H05K 7/1474; H05K 7/1465; H05K 7/1477
USPC ......................... 361/728, 755, 759, 801, 803
See application file for complete search history.

(56) References Cited

U.S. PATENT DOCUMENTS

| | | | | | |
|---|---|---|---|---|---|
| 5,148,353 | A | * | 9/1992 | Morgan | ................. G06F 1/183 361/732 |
| 6,418,027 | B1 | * | 7/2002 | Suzuki | ................. H05K 7/1478 361/752 |
| 6,431,909 | B1 | * | 8/2002 | Nolden | ................ H01R 9/2608 361/810 |
| 2004/0201972 | A1 | | 10/2004 | Walesa | |
| 2005/0231931 | A1 | * | 10/2005 | Bergmann | ........... H05K 7/1474 361/810 |

(Continued)

FOREIGN PATENT DOCUMENTS

WO          2004075357          9/2004

OTHER PUBLICATIONS

International Search Report for application No. PCT/EP2022/061191 dated Sep. 16, 2022.

*Primary Examiner* — Hung S. Bui
(74) *Attorney, Agent, or Firm* — Perman & Green, LLP

(57)          ABSTRACT

An assembly including: a rail which includes a base housing an electronic board and defining a plurality of slots, the base including a first cavity and two second cavities in each slot; and a module configured to be mounted and held fixedly and reversibly in a slot in the rail in a so-called operative position, the module including a housing including a retaining member projecting outward from the housing, an electronic board housed in the housing, and a locking member including a lever with two hooks. The assembly being such that when the module is in the operative position in a slot in the rail: the retaining member is inserted into the first cavity of the base, and each hook is inserted into a second cavity of the base.

10 Claims, 8 Drawing Sheets

(56) References Cited

U.S. PATENT DOCUMENTS

2011/0249399 A1    10/2011  Salles
2020/0221597 A1*   7/2020  Lostoski ............. H05K 7/1417

* cited by examiner

[Fig. 1]
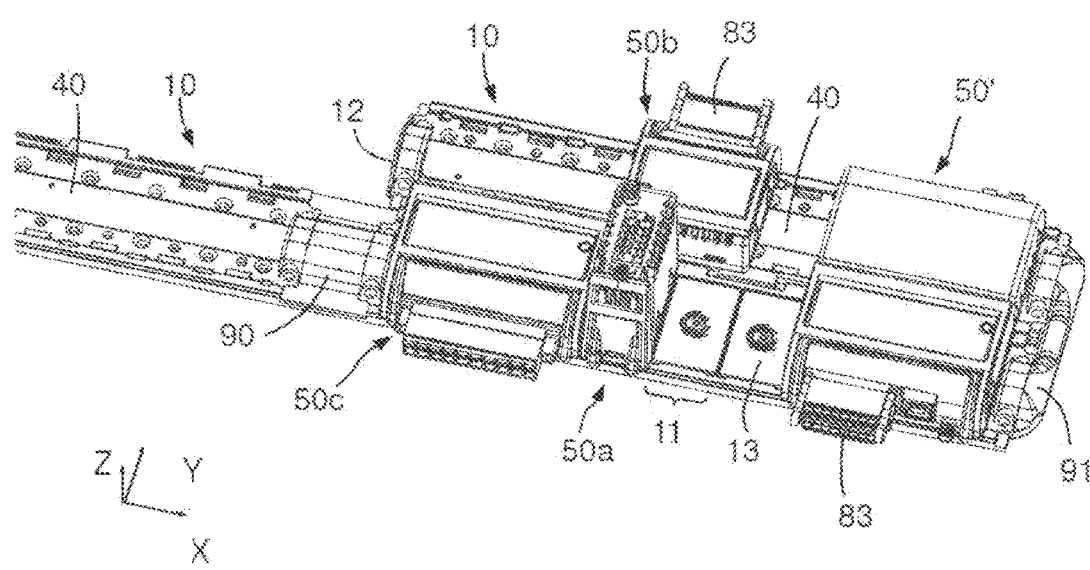
[Fig. 2]
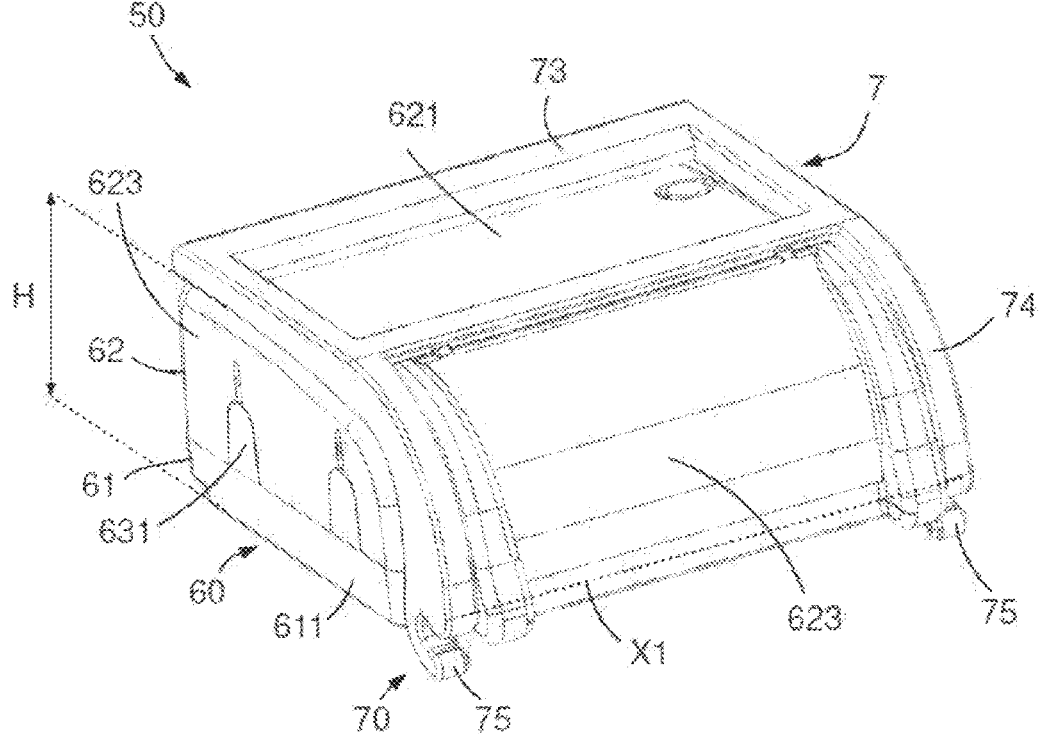

[Fig. 3]
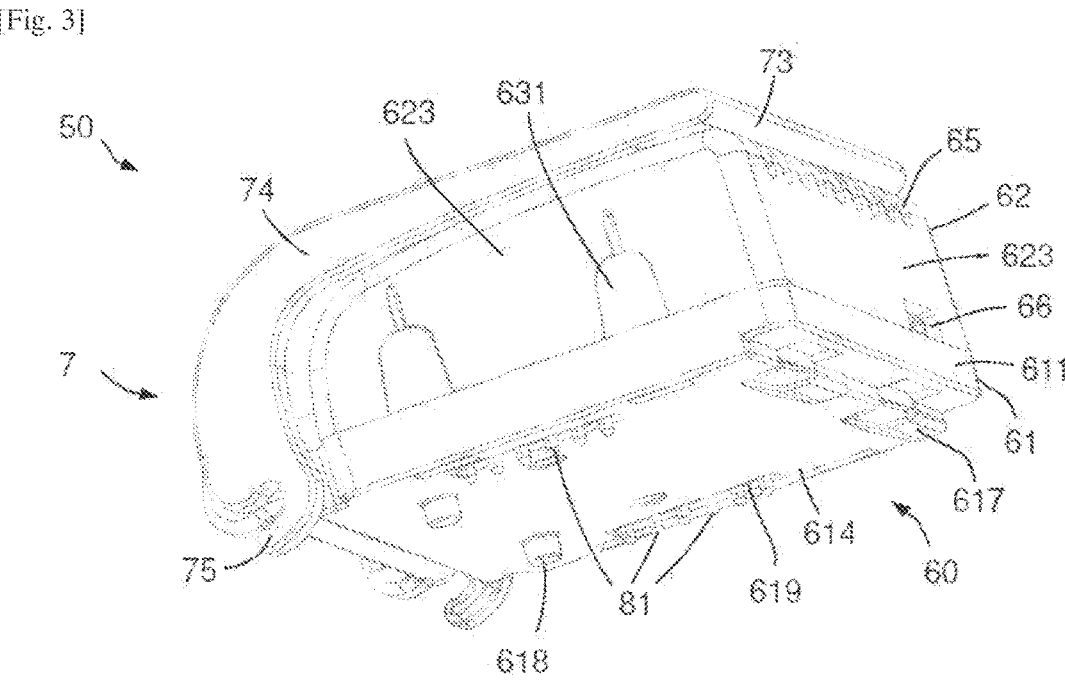
[Fig. 4]
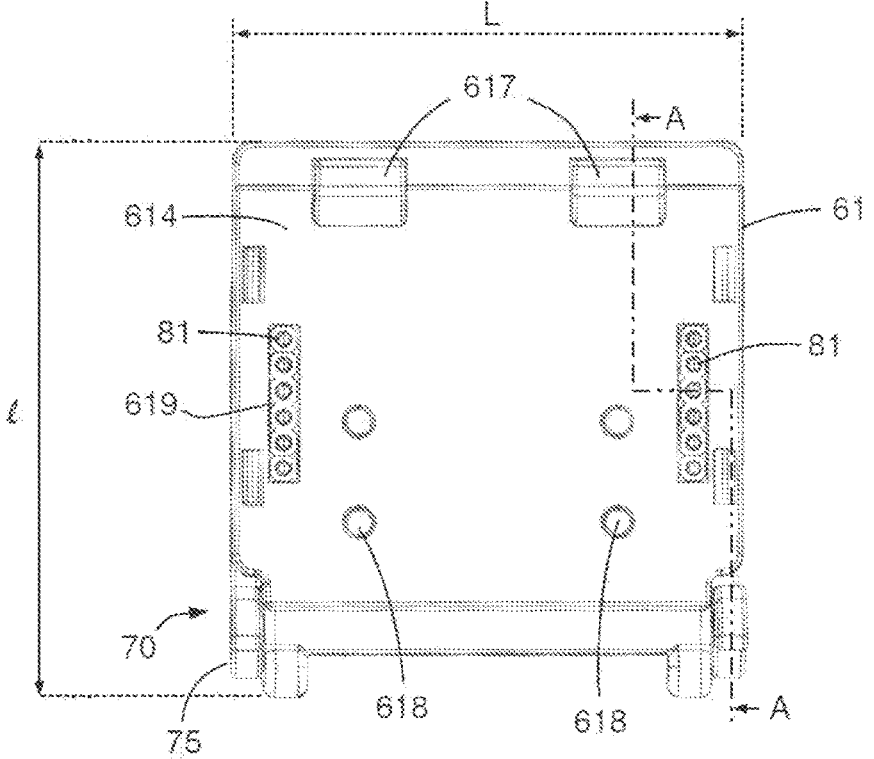

[Fig. 5]
[Fig. 6]
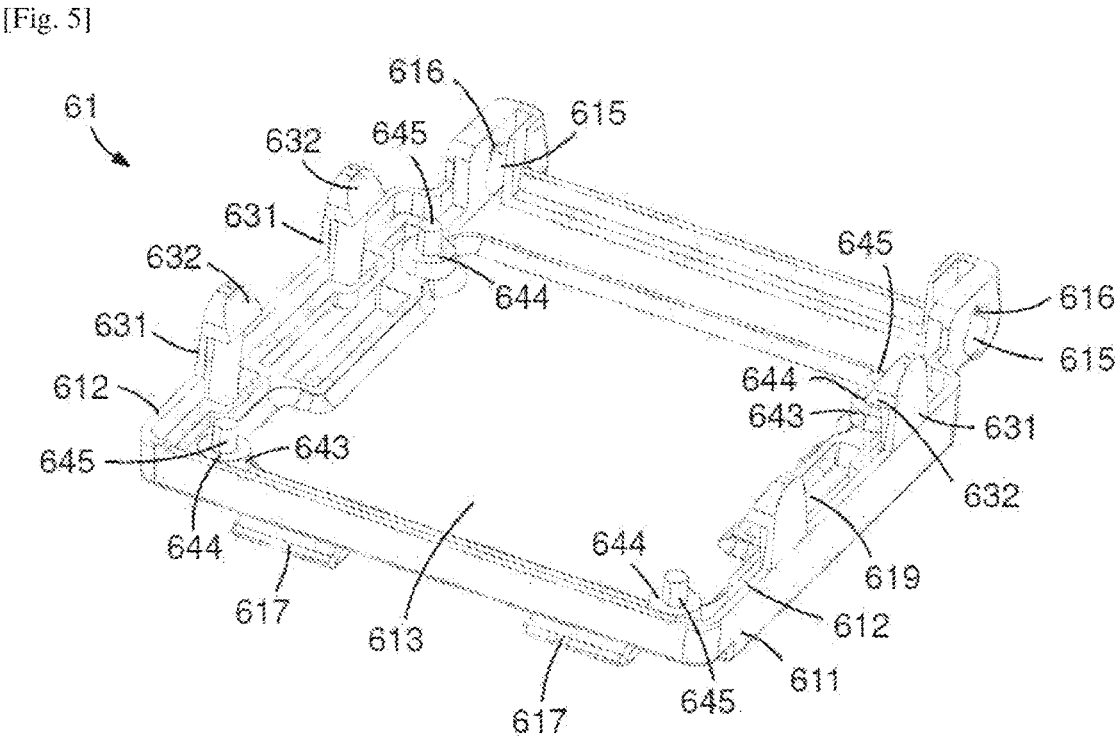

[Fig. 7]
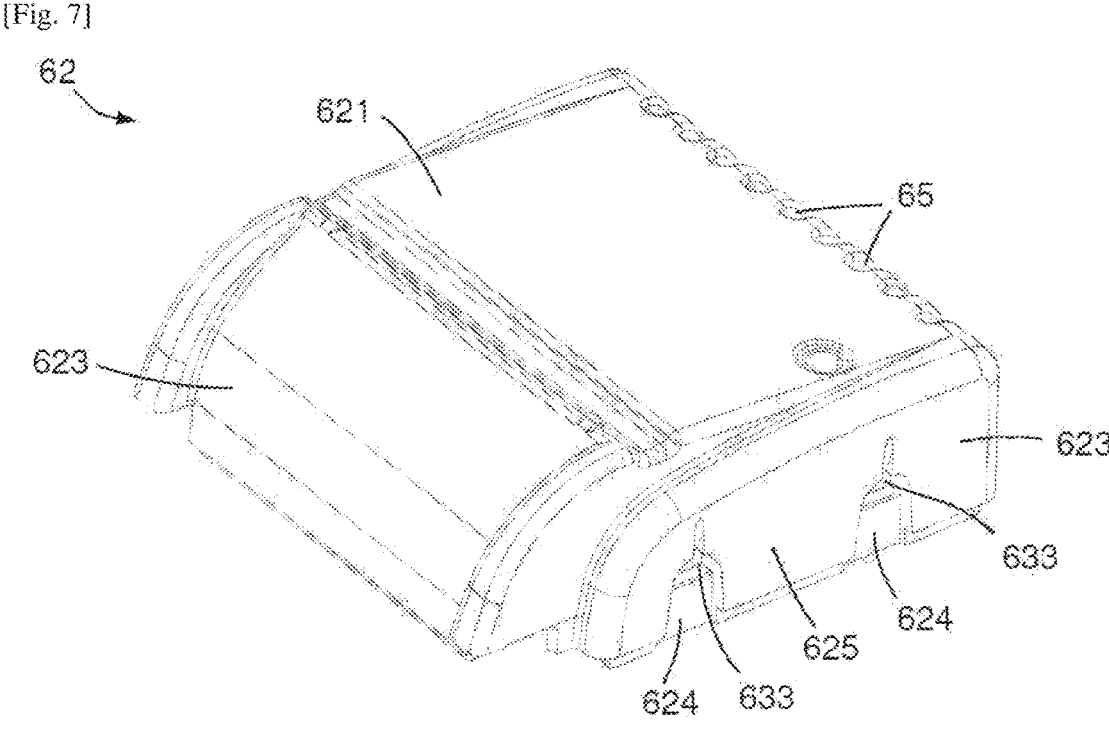
[Fig. 8]
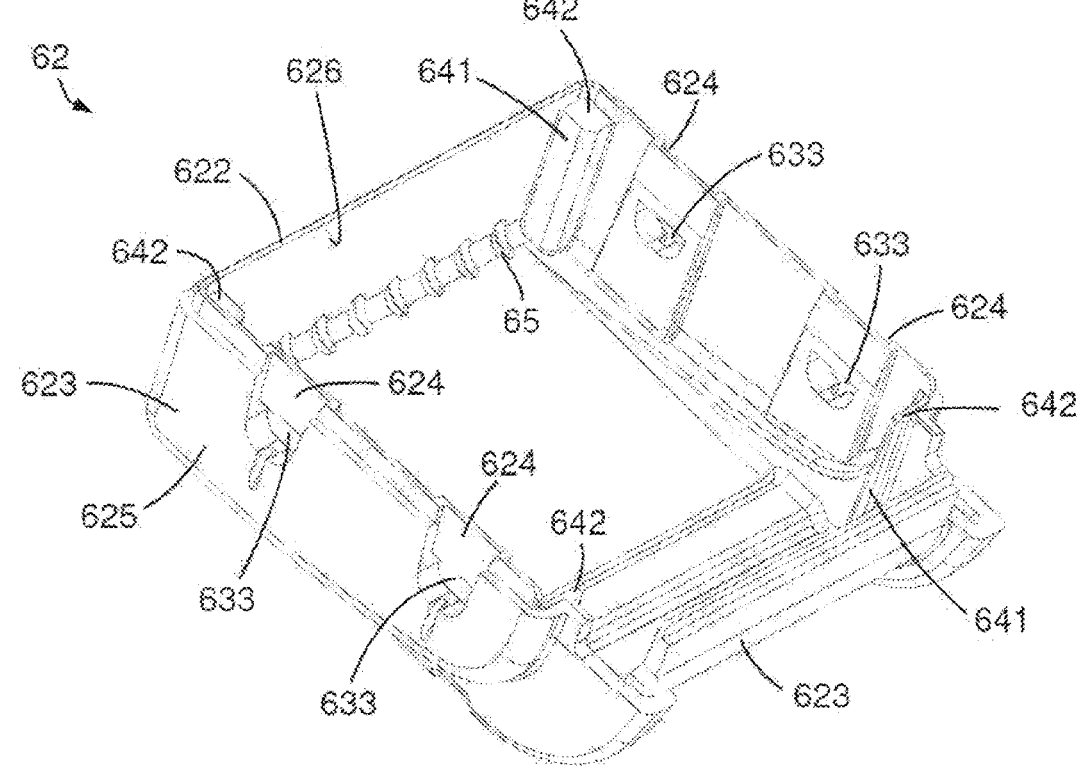

[Fig. 9]
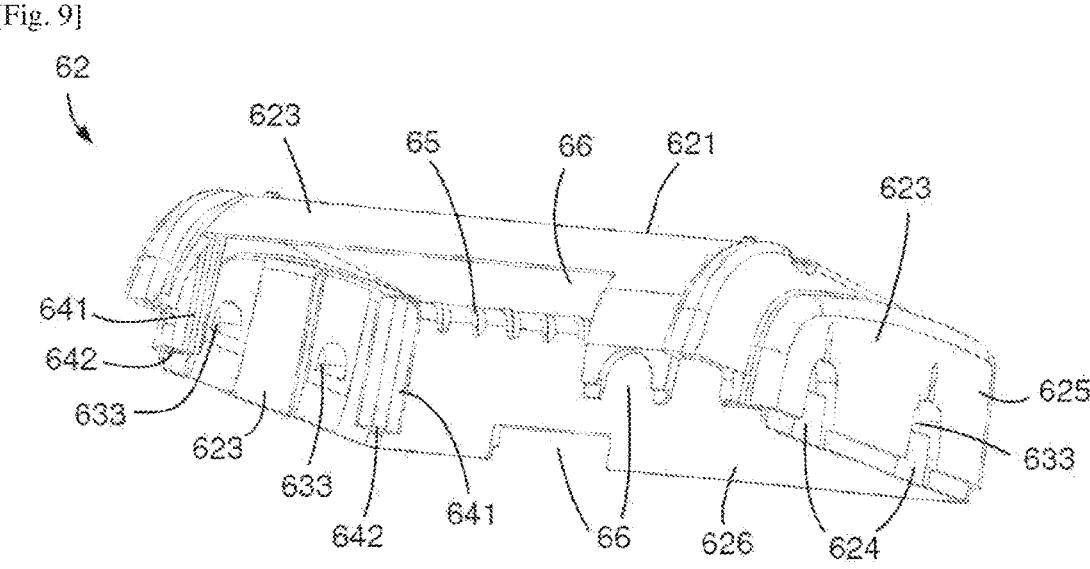
[Fig. 10]
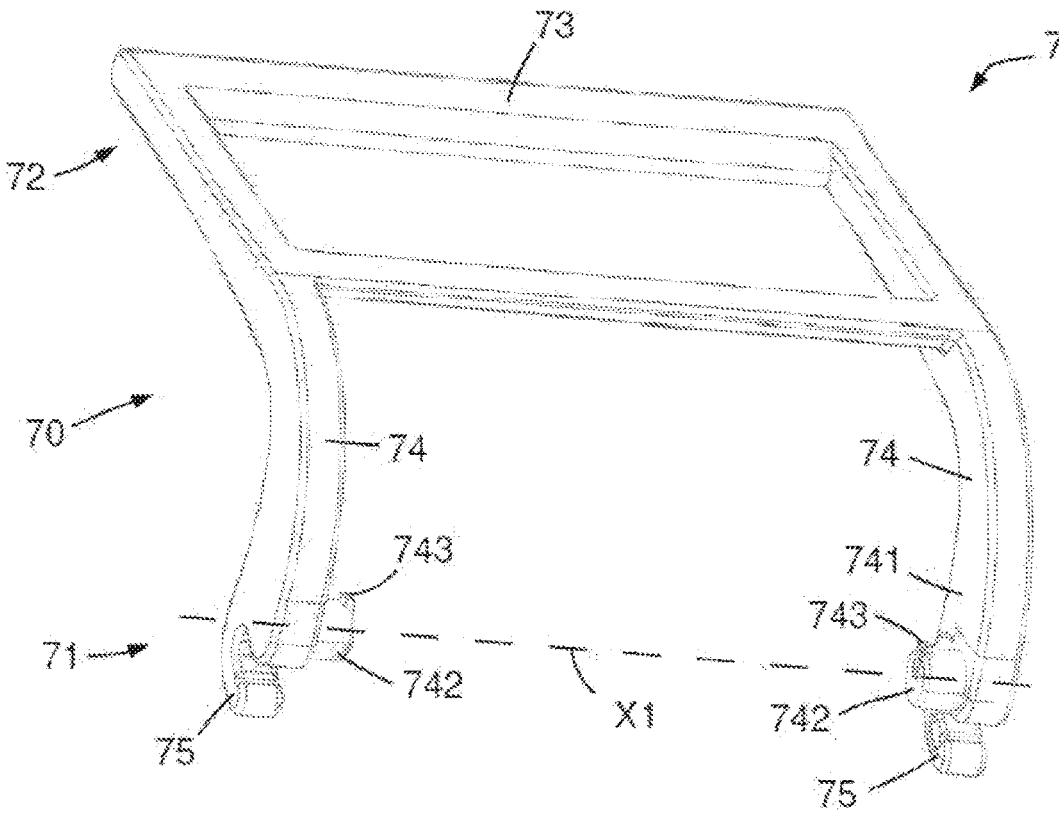

[Fig. 11]
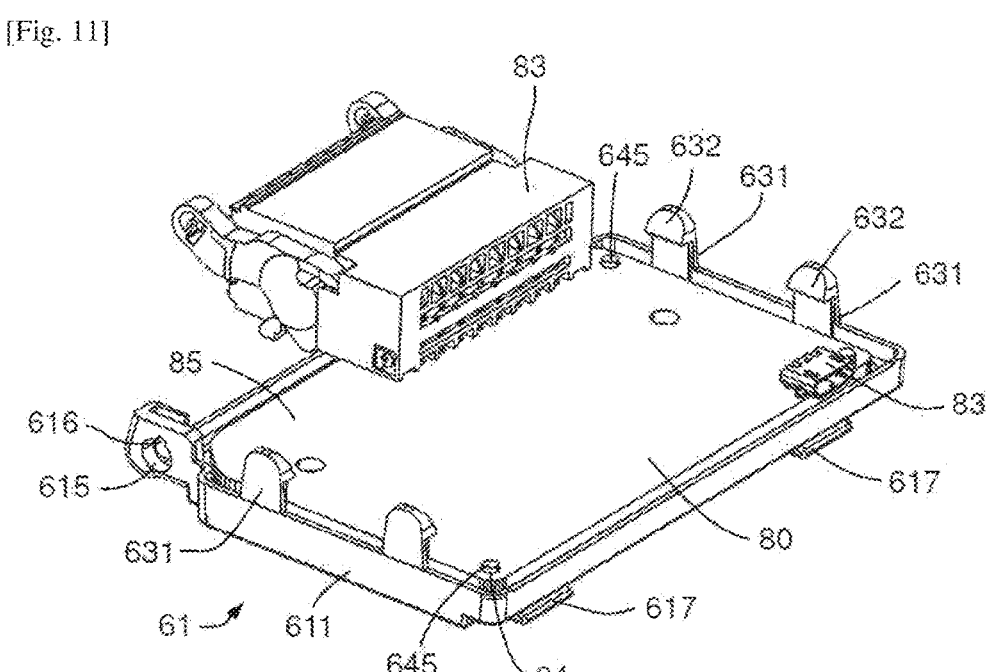
[Fig. 12]
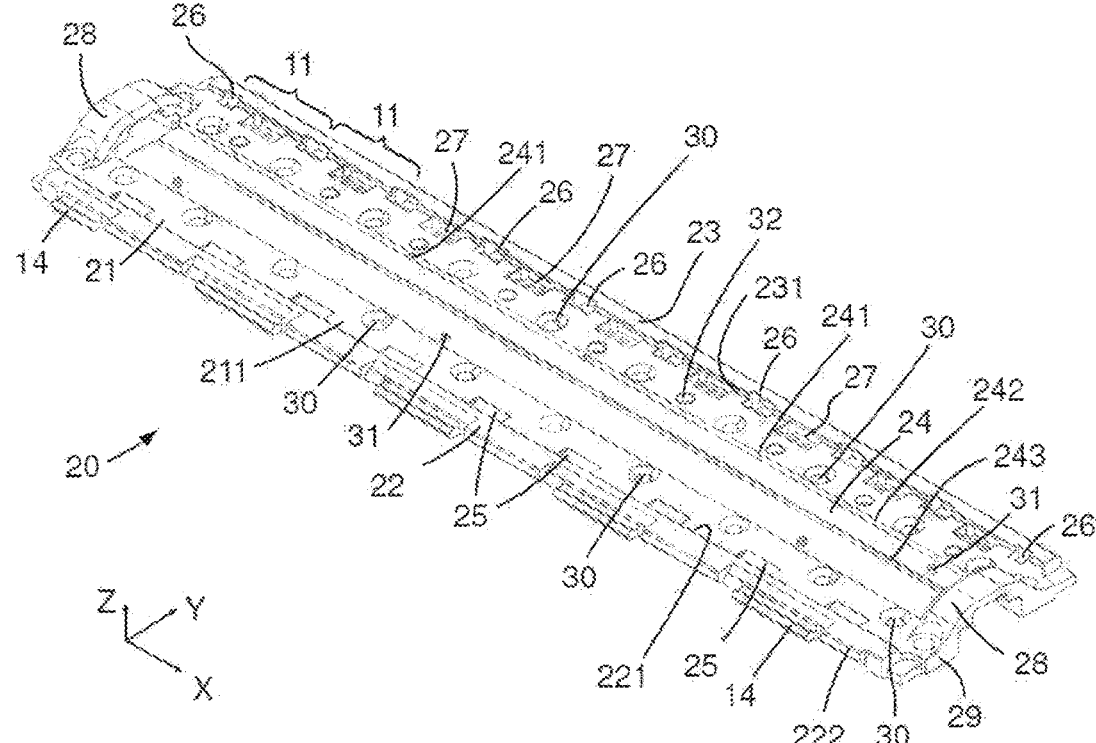

[Fig. 13]
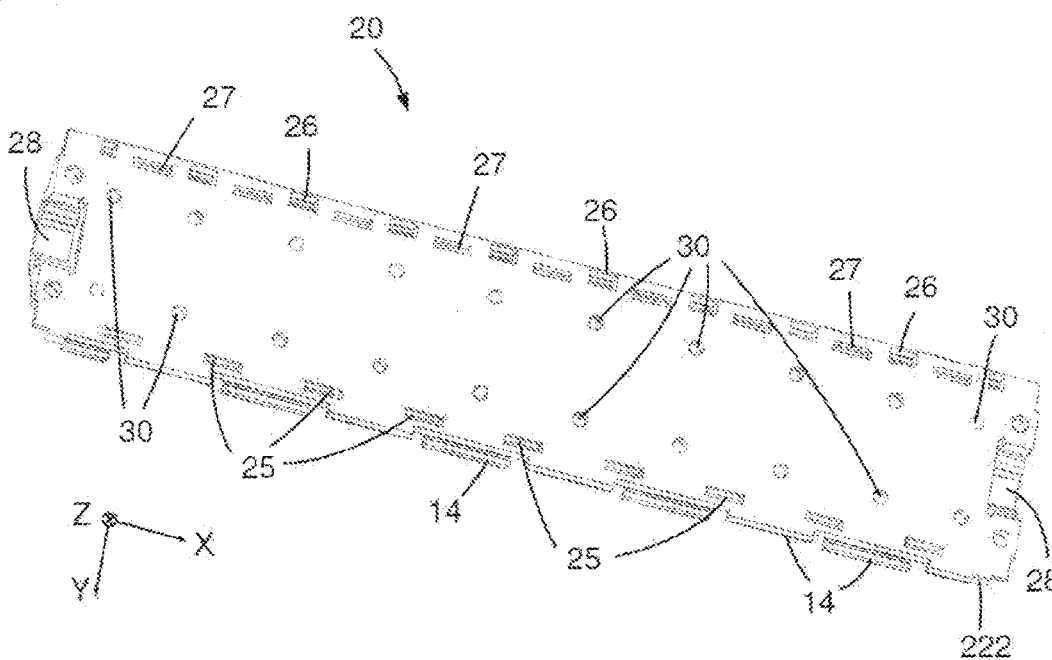
[Fig. 14]
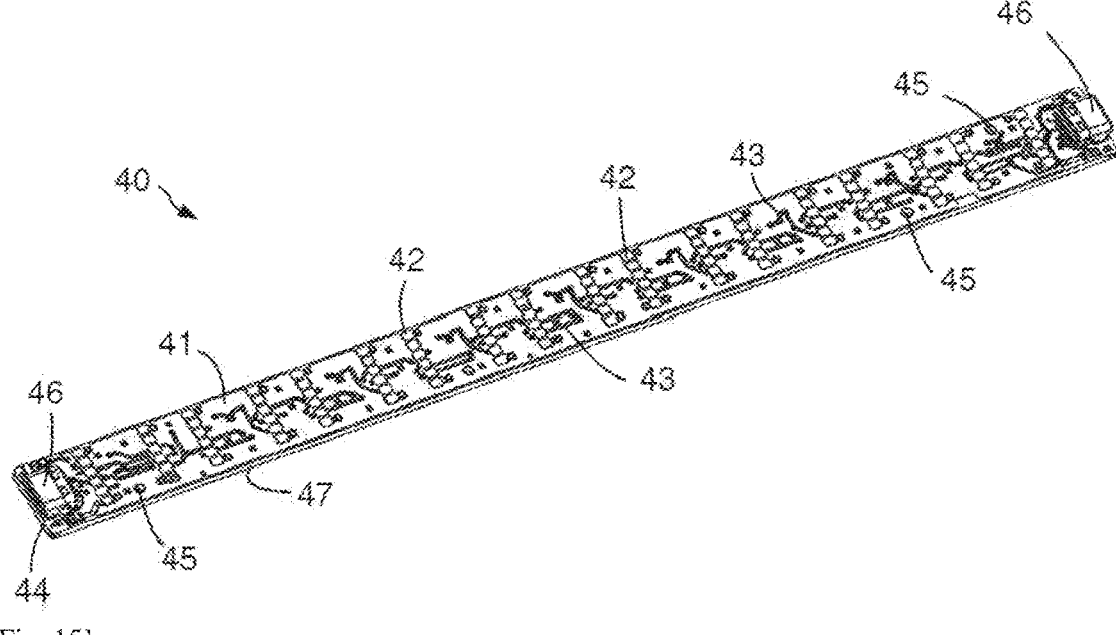
[Fig. 15]
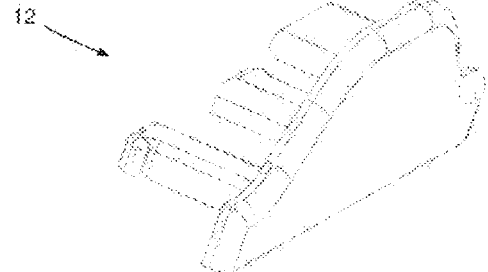

[Fig. 16]
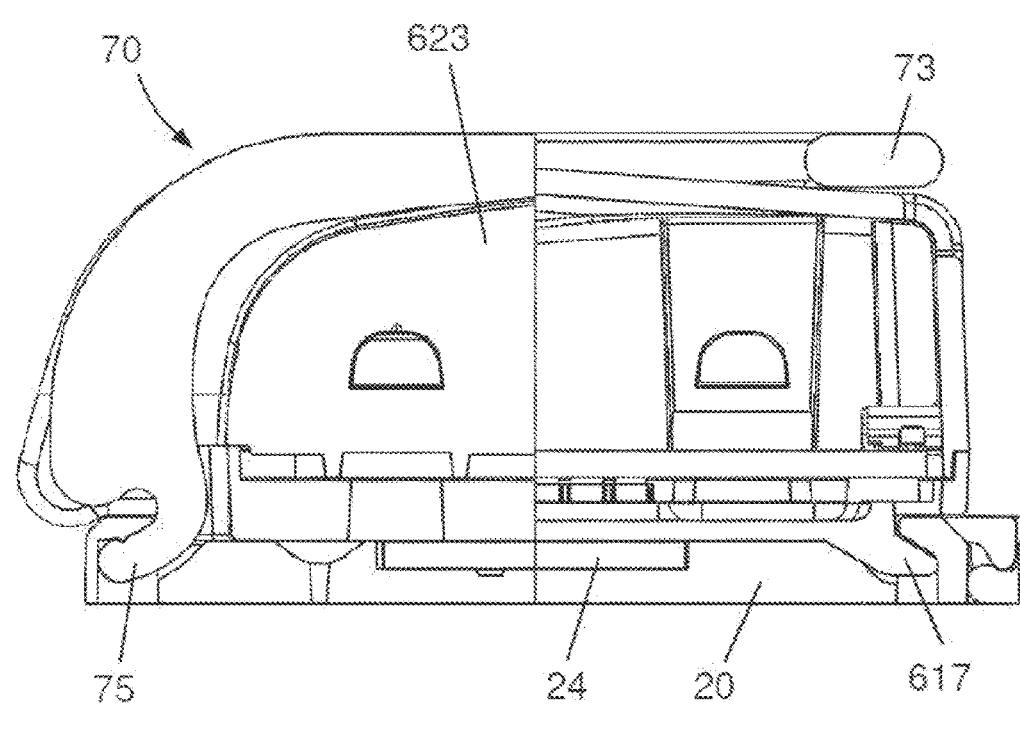
Coupe A-A

MODULAR ELECTRONIC ASSEMBLY

CROSS REFERENCE TO RELATED APPLICATIONS

This application is a National Stage of International Application No. PCT/EP2022/061191, having an International Filing Date of 27 Apr. 2022, which designated the United States of America, and which International Application was published under PCT Article 21(2) as WO Publication No. 2022/229255 A1, which claims priority from and the benefit of French Patent Application No. 2104432 filed on 28 Apr. 2021, the disclosures of which are incorporated herein by reference in their entireties.

BACKGROUND

Field

The disclosure relates to a modular electronic assembly, commonly referred to as a programmable logic controller, for the control of machines and equipment. In particular, the disclosure is intended for applications in the industrial, railway, naval, robotic field, or for test and experiment benches.

Brief Description of Related Developments

Current modular electronic assemblies are in the form of a board, so-called a backplane, comprising a plurality of connectors, and on which electronic modules are connected.

These electronic assemblies are primarily intended to be integrated into electrical cabinets and have dimensions, in particular in depth, which are not always compatible with use in restricted spaces.

In addition, the electronic modules should necessarily be positioned next to one another for the modular electronic assembly to operate.

Furthermore, the electronic modules are generally locked to the backplane plate by screwing. Hence, it is necessary for an operator to be equipped with a specific tool if he/she wishes to remove or add an electronic module when needed.

To sum up, current modular electronic assemblies are merely modular.

SUMMARY

The present disclosure aims to overcome the aforementioned drawbacks. The present disclosure is an alternative to current modular electronic assemblies.

To this end, a modular electronic assembly is provided by the present disclosure comprising:

a rail comprising a base, elongated according to an axis X, accommodating an electronic board so-called a backplane bus, elongated according to the axis X, said rail defining a plurality of slots aligned according to said axis X, the base comprising, at each slot, on the one hand, a first cavity and, on the other hand, two second cavities, the backplane bus comprising, at each slot, a row of female connectors, a plurality of electronic modules, so-called the modules, each module being configured to be mounted in at least one slot of the rail and to be fixedly and reversibly held therein in a so-called operative position, each module comprising:

a case comprising a bottom and a cap, the bottom comprising at least one retaining member projecting outwardly of said case, an electronic board accommodated in the case, comprising at least one connection pin formed by a row of male connectors which extend out of the case via a through aperture formed in the bottom of the case, a locking member comprising a lever mounted free to rotate relative to the bottom, said lever comprising two hooks at a proximal portion.

The modular electronic assembly is such that:

when a module is mounted in a slot of the rail and fixed in the operative position:

the bottom of said module is positioned opposite the rail, a retaining member of the bottom of said module is engaged in the first cavity of the base, each hook of the lever of the locking member of said module is engaged respectively in a second cavity of the base, the row of male connectors of a connection pin of the electronic board of said module is in contact with the row of female connectors, or when a module (50) is mounted in at least two adjacent slots of the rail and fixed in an operative position:

the bottom of said module is positioned opposite the rail, a retaining member of the bottom of said module is engaged in the first cavity of the base, at one of the at least two slots, one of the hooks of the lever of the locking member of said module is engaged in a second cavity of the base, at one of the at least two slots, and the other hook is engaged in a second cavity of the base, at another one of the at least two slots, the row of male connectors of a connection pin of the electronic board of said module is in contact with a row of female connectors at one of the at least two slots.

Locking a module on the rail is done, after insertion of the retaining member into the first cavity of the base, by rotating the lever of the locking member of said module until each hook of said lever engages in a second cavity of the base.

Thus, the module is fixedly held to the rail only on the one hand via the retaining member and on the other hand by the hooks of the lever.

Advantageously, such a modular electronic assembly enables mounting/dismounting of the module on/out of the rail, without using a particular tool, by rotating the lever of the locking member so as to engage/disengage each hook of said lever into/out of the second cavity of the base. Advantageously, such a modular electronic assembly allows providing a module the electronic board of which is preferably made so as to confer on said module one or more distinct function(s), such as for example the control of digital outputs, the control of motor drives, the analysis of analog inputs, cellular communication.

Advantageously, such a modular electronic assembly allows providing modules having reduced dimensions compared to existing modules and consequently could be used in restricted spaces.

Advantageously, such a modular electronic assembly allows providing modules dimensioned and configured so as to be mounted on one or more adjacent slot(s).

By to the electronic design of the backplane bus, such a modular electronic assembly advantageously allows mounting modules on the rail in adjacent slots or in remote slots.

Advantageously, such a modular electronic assembly may be configured to directly integrate in particular wireless modems, motor controllers, digital or analog inputs and outputs or communication buses.

According to particular aspects, the modular electronic assembly according to the disclosure further meets the following features, implemented separately or in any technically-feasible operative combination thereof.

In preferred aspects, each second cavity is:

arranged astride two adjacent neighbouring slots of the rail, dimensioned so as to receive two hooks of two modules each arranged in one of said two slots.

Advantageously, such a configuration allows limiting the loss of space between two adjacent modules.

In preferred aspects, the modular electronic assembly is configured so that:

at each slot of the rail, the base comprises a receiving hole, the bottom of the case of a module comprises an orientation lug.

In such a configuration, the modular electronic assembly being such that when the module is mounted in at least one slot of the rail and fixed in an operative position, the orientation lug cooperates with a receiving hole of the base, at the slot of the rail. Advantageously, such an orientation lug allows preventing positioning of the case of the module on the rail, when said case is not positioned on the rail in the proper direction.

In preferred aspects, to guarantee positioning of the electronic board in the case of a module, said case comprises elements for holding the electronic board in position in the case.

In preferred aspects, the case of a module comprises a through opening formed in the cap for the passage of a secondary connector arranged on the electronic board of the module. Such a secondary connector is intended to interact with at least one computer or industrial type connector, such as for example a 16-point industrial connector with a 3.5 mm step or an A/B type micro USB connector.

In preferred aspects, the rail comprises clipping elements intended to cooperate with clipping elements of another rail. Such clipping elements allow, when they cooperate with the clipping elements of another rail, holding the rail in position parallel to the other rail, according to the axis X.

In preferred aspects, the modular electronic assembly comprises two rails and a union connector for mechanically and electrically assembling said two rails.

In some aspects, the union connector is a straight union connector. Advantageously, such a straight union connector allows assembling two rails end-to-end, mechanically and electrically. By end-to-end assembly, it should be understood that the axes X of each rail are coincident.

In some aspects, the union connector is a U-shaped union connector such a union connector advantageously allows mechanically and electrically assembling two longitudinally adjacent rails. In these aspects, the axes X of the two rails are parallel.

In preferred aspects, the modular electronic assembly comprises two rails and a two-rail electronic module. The two-rail electronic module is configured, when the two rails are longitudinally adjacent, to be mounted in at least one slot of each rail and to be fixedly and reversibly held therein in an operative position.

The base comprises a third cavity at each slot.

Each two-rail module has the same features as the module except that the two-rail module is dimensioned so as to be positioned in two slots of two longitudinally adjacent rails, one slot per rail.

In particular, the two-rail module comprises:

a case comprising a bottom and a cap, the bottom comprising a retaining member projecting outwardly of said case, an electronic board accommodated in the case, comprising a connection pin formed by a row of male connectors which extend out of the case via a through aperture formed in the bottom of the case, a locking member comprising a lever mounted free to rotate relative to the bottom, said lever comprising two hooks at a proximal portion.

When a two-rail module is in the operative position in one slot of each rail:

the bottom of said two-rail module is positioned opposite the two rails, the retaining member of the bottom of said two-rail module is engaged in the third cavity of the base of a rail, each hook of the lever of the locking member of the two-rail module is engaged in a second cavity of the base of the other rail, the row of male connectors of the electronic board of the two-rail module is in contact with the row of female connectors of one of the two rails.

The present disclosure also relates to a rail for a modular electronic assembly in accordance with at least one of its aspects.

The present disclosure also relates to an electronic module for a modular electronic assembly in accordance with at least one of its aspects.

BRIEF DESCRIPTION OF THE FIGURES

The disclosure will be better understood upon reading the following description, given as a non-limiting example, and made with reference to the following figures:

FIG. 1 illustrates an example of a modular electronic assembly illustrating different versions of electronic modules;

FIG. 2 shows a perspective view of an example of an electronic module of a modular electronic assembly;

FIG. 3 shows another perspective view of the electronic module of FIG. 2;

FIG. 4 shows a bottom view of the electronic module of FIG. 2;

FIG. 5 shows a perspective top view of a bottom of a case of the electronic module of FIG. 2;

FIG. 6 shows a perspective bottom view of the bottom of the case of FIG. 5;

FIG. 7 shows a perspective top view of a cap of a case of the electronic module of FIG. 2;

FIG. 8 shows a perspective bottom view of the cap of the case of FIG. 7;

FIG. 9 shows a perspective view of another example of a cap of a module;

FIG. 10 shows a perspective view of a locking member of the electronic module of FIG. 2;

FIG. 11 shows a perspective view of an electronic board positioned in the case of the module of FIG. 2;

FIG. 12 shows a perspective top view of an example of a base of a rail of a modular electronic assembly;

FIG. 13 shows a perspective bottom view of the base of the rail of FIG. 11;

FIG. 14 shows a perspective view of an example of a backplane bus of a rail of a modular electronic assembly;

FIG. 15 shows an example of a lateral lid intended to be assembled at a longitudinal end of a rail;

FIG. 16 shows a sectional view of the electronic module of FIG. 2, according to a broken section with parallel planes A-A shown in FIG. 4.

In these figures, identical reference numerals from one figure to another refer to identical or similar elements. Moreover, for clarity, the drawings are not plotted to scale, unless stated otherwise.

DETAILED DESCRIPTION

A modular electronic assembly 1 according to one aspect, and illustrated in FIGS. 1 to 16, is a programmable logic controller. In the rest of the description, the modular electronic assembly 1 will be called the assembly 1.

The assembly 1 comprises at least one rail 10 and at least one electronic module 50. Each electronic module 50 is intended to be reversibly fastened to one single rail. The electronic module 50 is a one-rail module.

The assembly 1 may comprise at least one other electronic module 50', so-called two-rail module. Each two-rail module 50' is intended to be reversibly fastened to two longitudinally contiguous rails, as will be explained later on.

For illustration, FIG. 1 illustrates one assembly 1 with three rails 10, three one-rail modules 50a, 50b, 50c and a two-rail module 50'.

In the rest of the description, a reference frame XYZ will be associated with the rail 10, wherein:

X denotes a longitudinal axis of the rail, and corresponds to a longitudinal direction of the rail, Y denotes an axis perpendicular to X, and corresponds to a transverse direction of the rail, Z denotes an axis perpendicular to X and Y.

The rail 10 comprises a plurality of slots 11 intended to receive electronic modules 50. The slots 11 are aligned next to one another.

In the non-limiting example of FIG. 1, each rail 10 comprises nine slots 11.

The rail 10 comprises a base 20 and an electronic board so-called the backplane bus 40.

The rail 10 will be described in more detail later on.

An electronic module, or one-rail module or module 50, comprises a case 60, intended to be reversibly fastened to the base 20, an electronic board 80 intended to cooperate with the backplane bus 40 and a locking member 7.

Some modules 50 have lengthwise dimensions adapted so as to be inserted, with some clearance, into one single slot 11 of the rail 10. These modules are so-called simple modules. A simple module is shown under the reference 50a in FIG. 1, as example.

Some modules 50 have lengthwise and widthwise dimensions adapted so as to be inserted, with some clearance, into several adjacent slots 11 of the rail.

A module 50 is mounted on the rail 10 up to a so-called operative position, in which said module 50 is in place in the rail 10 and reversibly locked, in its slot(s) 11.

Preferably, some modules 50 have lengthwise and widthwise dimensions so as to be inserted into two or three adjacent slots 11 of the rail. These modules 50 are so-called double or triple modules. A triple module is shown under the reference 50c and a double module is shown under the reference 50b in FIG. 1, as example.

The modules 50, whether they are simple, double, triple, etc., may have different heights, as illustrated in FIG. 1.

Preferably, the modules 50 have two standard heights. The modules 50 are so-called horizontal module or vertical module, depending on their height. A vertical module has a height at least twice the horizontal module.

Thus, in the example of FIG. 1, a triple horizontal module 50c and a simple vertical module 50a are illustrated.

The modules 50 according to the disclosure have reduced dimensions compared to existing modules and thus have numerous advantages, in particular, being able to be used in restricted spaces.

In a non-limiting aspect, a simple horizontal module has a lengthwise dimension of 25.50 mm, a widthwise dimension of 53 mm and a height of 25 mm. A double horizontal module has the same width and height dimension as the simple horizontal module, but has a length of 51 mm. A triple horizontal module has the same width and height dimension as the simple horizontal module, but has a length of 76.50 mm. A simple vertical module has the same length and width dimension as the simple horizontal module, but has a height of 51.5 mm. A double vertical module has the same width and height dimension as the simple vertical module, but has a length of 51 mm. A triple vertical module has the same width and height dimension as the simple vertical module, but has a length of 76.5 mm.

Electronic Module—One-Rail Module

An example of a module 50 is described in FIGS. 2 to 11.

As described before, a module 50 comprises a case 60, an electronic board 80 and a locking member 7.

The case 60 defines an inner housing dimensioned so as to receive the electronic board 80.

Preferably, the case 60 comprises two portions, which, when they are assembled together, delimits the inner housing of said case.

A first portion of the case is so-called the bottom 61 and is shown in FIGS. 5 and 6. A second portion of the case is so-called the cap 62 and is shown in FIG. 7 to 9.

Preferably, the case 60 has, when the bottom 61 and the cap 62 are assembled, a substantially parallelepipedal general shape.

Thus, each case 60 has a length L, a width 1 and a height H.

When a module 50 is inserted in one or more slot(s) 11 of the rail 10, the case 60 is positioned so that its length L extends according to the axis X of the rail, its width 1 extends according to the axis Y and its height H extends according to the axis Z.

When a module 50 is inserted into one or more slot(s) 11 of the rail, the bottom 61 of the case 60 is intended to lie opposite the rail 10.

Thus, the bottom 61 of the case 60 of a simple module 50 is dimensioned and configured so as to conform to the shape of one slot 11 of the rail. By extension, the bottom 61 of the case 60 of a double or triple module 50 is dimensioned and configured so as to conform to the shape of two, or three, adjacent slots 11 of the rail.

In a preferred, non-limiting example, the bottom 61 comprises a wall, so-called the lower wall 611, as illustrated in FIGS. 5 and 6. The cap 62 comprises a wall, so-called the upper wall 621, and lateral walls 623, herein four in number, as illustrated in FIGS. 6 to 8. The upper wall 621 is intended to be opposite the lower wall 611 of the bottom 61 when said bottom and said cap are assembled. Preferably, the lateral walls 623 are arranged at a peripheral edge 622 of the upper wall 621 and extend substantially perpendicularly to said upper wall. Said lateral walls 623 are intended to be opposite a peripheral edge 612 of the lower wall 611 of the bottom 61, when the bottom 61 and the cap 62 are assembled.

Nothing prevents making a bottom with the lower wall and the lateral walls and the cap with the upper wall.

When a module 50 is inserted in one or more slot(s) 11 of the rail 10, the opposite lateral walls 623 located according to the axis X of the rail 10 are called front lateral wall and rear lateral wall.

Preferably, the bottom 61 and the cap 62 of the case 60 are assembled in a reversible manner. For example, the case 60 may comprise clipping means for holding the bottom 61 and the cap 62 in position with respect to each other.

Any other suitable reversible fixing means may also be considered for assembling the bottom and the cap, without departing from the scope of the disclosure.

In a preferred aspect, the clipping means comprise first clipping members arranged at the bottom 61, intended to cooperate with second clipping members, complementary to said first clipping members, arranged at the cap 62.

In one aspect, illustrated in FIGS. 7 to 9, the second clipping members are formed by at least one through hole 633, formed in at least two lateral walls 623, preferably two opposite lateral walls. The first clipping members of the bottom are formed by at least one flexible leg 631 which extends from the peripheral edge 612 of the lower wall 61 and which comprises, at a free end, a lug 632, as illustrated in FIGS. 5 and 6. Each flexible leg 631 is arranged so as to deform and then to accommodate the associated lug 632 in a through orifice 633, when the cap 62 is assembled at the bottom 61.

In the non-limiting example of FIGS. 5 and 8, the clipping means are formed by two through orifices 633 formed in two opposite lateral walls 623 of the cap 62 and four flexible legs 631 with a lug 632 at the lower wall 611.

The deformation of the flexible legs 631 for clipping and unclipping the bottom 61 and of the cap 62 occurs outwardly of the case 60.

The lateral walls 623 receiving the second clipping members comprise at least one recess 624, extending from an outer face 625, and dimensioned so as to receive a flexible leg 631 of the first clipping members, so that, when the bottom 61 and the cap 62 are assembled, each flexible leg 631 is flush with an outer face 625 of the associated lateral wall 623, as illustrated in FIGS. 2 and 3.

By "outer face" of a lateral wall or of the upper wall or of the lower wall, and by "extension" of the cap and of the base, it should be understood the face opposite an inner face which is arranged on the side of the inner housing of the case.

Thus, the outer face of the bottom corresponds to the outer face of the lower wall and the inner face of the bottom corresponds to the inner face of the lower wall. The outer face of the cap corresponds to all of the outer faces of the lateral walls and of the upper wall. The inner face of the cap corresponds to all of the inner faces of the lateral walls and of the upper wall.

In one aspect, the case 60 comprises elements for holding the electronic board 80 in position in said case.

In an aspect of the holding elements in position, illustrated in FIGS. 8 and 9, the cap 62 may comprise, at an inner face 626, ribs forming shoulders 641. Each of its shoulders 641 has a bearing surface 642. The bearing surfaces 642 of the shoulders 641 of the cap 62 are contained in the same plane, so-called the first plane. The bottom 61 may comprise, as illustrated in FIG. 5, pins, extending for example from an inner face 613 of the lower wall 611, and forming shoulders 643. Each of its shoulders 643 has a bearing surface 644. The bearing surfaces 644 of the shoulders 643 of the bottom 61 are contained in the same plane, so-called the second plane. In the example illustrated in FIG. 5, the bottom 61 comprises four bearing surfaces 644.

Preferably, each of the bearing surfaces 642 of the shoulders 641 of the cap 62 is located proximate to a bearing surface 644 of a shoulder 643 of the bottom 61. Thus, when the bottom 61 and the cap 62 of the case 60 are assembled, the first plane and the second plane are substantially parallel, separated by a distance, referred to as the bearing gap. Advantageously, this bearing gap corresponds substantially to a thickness of the electronic board 80, or may be slightly smaller. Thus, simply by accommodating the electronic board 80 between the bottom 61 and the cap 62 of the case 60, and by closing the cap 62 and the bottom 61 on one another, the electronic board 80 is engaged between the bearing surfaces 642 of the shoulders 641 of said cap and the bearing surfaces 644 of the shoulders 643 of said bottom.

In another aspect of the holding elements in position, complementarily or not with the previous aspect, in order to guarantee the positioning of the electronic board 80 in the case 60 before closing it, each of the shoulders 643 of the bottom 61 is provided with a spike 645 extending from the bearing surface 644 of said shoulder, as illustrated in FIG. 5. Each spike 645 is configured to be inserted into through orifices 84 formed in the thickness of the electronic board 80. Preferably, a spike 645 has a lengthwise dimension that is substantially equivalent, or at most equal, to the thickness of the electronic board 80.

The module 50 further comprises a locking member 7 intended to hold the module 50 in the operative position on the rail 10, when said module is installed on the rail 10.

Preferably, as illustrated in FIGS. 2, 3, the locking member comprises a lever 70, mounted free to rotate relative to the bottom 61.

This lever 70 comprises a proximal portion 71 intended to be connected to the bottom 61 and a distal portion 72 defining a gripping portion for a user of the module 50.

In a preferred aspect, illustrated in FIG. 10, the lever 71 is formed by two arms 74 connected together by a transverse branch 73, for example at the distal portion 72.

Each of the two arms 74 comprises, at an internal face 741, facing the bottom 61, a mounting pin 742 which is intended to be inserted into an orifice 615 of the bottom 61.

Preferably, the mounting pins 742 are arranged at the proximal portion 71 of the lever 70.

The mounting pins 742, preferably cylindrical shaped, form pivots enabling pivoting of the lever 70 about an axis of rotation X1 transverse to said lever passing through these mounting pins.

Preferably, the mounting pins 742 are arranged at one side of the lower wall 611.

When a module 50 is inserted into one or more slot(s) 11 of the rail, the case 60 is positioned so that the axis X1 is parallel to the axis X of the rail.

The lever 70 comprises, at the proximal portion 71, two hooks 75, one hook per arm. Each hook 75 is intended to cooperate with a specific element of the rail, as will be explained in detail later on.

The lever 70 is movable about its axis of rotation between a locked position, in which each hook 75 cooperates with said specific element of the rail, and an unlocked position, in which each hook 75 does not cooperate with said specific element.

Preferably, to facilitate mounting and dismounting of the module 50, the lever 70 is removable.

In one aspect, each of the mounting pins 742 comprises a radial excrescence 743 intended to cooperate with a complementary recess 616 at the associated orifice 615 of the bottom.

The positioning of the radial excrescence 743 on the mounting pins 742 and that of the complementary recess 616 of the associated orifices 615 of the bottom have been defined and arranged such that the lever 70 could be mounted on the bottom 61 only in the absence of the cap 62.

Once the cap 62 is associated with the bottom, if the lever 70 has not been connected to the bottom 61, it is no longer possible to do so. If the lever 70 has been connected to the bottom 61, it is no longer possible to remove the lever, unless the cap 62 is removed at first.

Preferably, the lower wall 611 of the bottom 61 and at least one lateral wall 623 of the cap 62 may comprise a cutout dimensioned so as to receive the two arms 74 of the lever 70, so that, when the bottom 61 and the cap 62 are assembled, the two arms 74 are flush with the outer face of the cap 62.

In one aspect, as illustrated in FIGS. 3, 6, 11, the bottom 61 of the case 60 comprises at least one retaining member 617 projecting outwardly of the case 60. Said at least one retaining member 617 projects from the outer face 614 of the lower wall 611 of the bottom 61. Said at least one retaining member 617 is intended to cooperate with a specific element of the rail, as will be explained later on.

Advantageously, the at least one retaining member 617 contributes, with the lever 70, to the fixed holding of the module 50 in the rail 10.

In the example of the simple module, the case 60 comprises only one retaining member 617.

In the example of the double module, the case 60 comprises two retaining members.

In the example of the triple module, the case 60 may comprise two or three retaining members 617.

In one aspect, illustrated in FIGS. 3 and 6, the bottom 61 of the case 60 comprises an orientation lug 618.

The orientation lug 618 projects outwardly of the case 60, from the outer face 614 of the lower wall 611 of the bottom 61.

Said orientation lug is intended to cooperate with a specific element of the rail, as will be explained later on.

Advantageously, the orientation lug 618 allows preventing positioning of the case 60 on the rail 10, when said case is not positioned on the rail 10 in the proper direction. In other directions, the orientation lug 618 of the module acts as a keying device.

Preferably, the case 60 and the locking member are made of a rigid material, for example made of Polycarbonate/ Acrylonitrile Butadiene Styrene (acronym: PC/ABS).

Preferably, the case 60 and the locking member are made by injection moulding.

As described before, the module 50 comprises an electronic board 80.

Preferably, said electronic board is a printed circuit board or PCB (standing for "Printed Circuit Board") which comprises a plate-shaped support 85 allowing holding and electrically connecting a plurality of electronic components together.

Preferably, an electronic board is made in order to confer on the module containing it, one or more distinct function(s), such as for example the control of digital outputs, the control of motor drives, the analysis of analog inputs, cellular communication.

The electronic board 80 of a module 50 is intended to interface with the backplane bus 40 of the rail 10, as illustrated in FIGS. 4 and 5.

Preferably, the electronic board 80 of the case 50 comprises at least one connection pin formed by a row of aligned male connectors 81 intended to cooperate with a row of female connectors 42 of the backplane bus 40 of the rail 10. More preferably, the electronic board 80 of the module 50 comprises two connection pins.

Preferably, the at least one connection pin extends from a face 82 of said electronic board opposite the bottom 61 when the electronic board is in position in the case 60.

In the non-limiting example of FIGS. 3 and 4, the electronic board 80 comprises two connection pins, each connection pin comprising a row of six male connectors 81.

In one aspect, the male connectors 81 are spring-biased lugs. To enable the passage of the male connectors 81 out of the case 60, the bottom 61 comprises at least one through aperture 619, opposite the at least one connection pin, when the electronic board 80 is in position in the case 60.

Preferably, the bottom 61 of the case 60 comprises two through apertures 619, as illustrated in FIGS. 3 to 5.

In one aspect, as illustrated in FIGS. 3, 5, 7, the case 60 comprises vent holes 65. Advantageously, said vent holes allow conveying the air flows for cooling the electronic components of the electronic board 80 of the module 50.

Preferably, the vent holes 65 are formed in the cap 62, at least at one of the lateral walls 623 and/or the upper wall 621.

In one aspect, as illustrated in FIG. 11, the electronic board 80 of the module 50 may comprise at least one connector, so-called the secondary connector 83, intended to interact with at least one type of connector either of the computer or industrial type, such as for example an A/B type micro USB connector.

To enable the passage of at least one secondary connector 83 out of the case 60, said case may comprise, as illustrated in FIG. 9, a through opening 66 formed in the cap 62, at least at one of the lateral walls 623 and/or the upper wall 621, opposite the secondary connector 83 when the electronic board 80 is in position in the case 60.

In a preferred aspect, for a horizontal module 50, the case 60 comprises a through opening 66 at the front lateral wall of the cap 62 for the passage of an industrial-type secondary connector and comprises a through opening 66 at the rear lateral wall of the cap 62 for the passage of a computer-type secondary connector.

For a vertical module 50, the case 60 comprises a through opening 66 at the front lateral wall of the cap 62 for the passage of a computer-type secondary connector and comprises a through opening 66 at the upper wall 621 of the cap 62 for the passage of an industrial-type secondary connector.

In the non-limiting example illustrated in FIG. 1, for the module 50c, the case comprises a through opening at one of the lateral walls of the cap for the passage of an industrial-type secondary connector 83. The case of the module 50a comprises a through opening at the upper wall of the cap for the passage of an industrial-type secondary connector 83.

In one aspect, the case 60 may comprise a breakable portion (not shown). Said breakable portion may consist of a local reduction in the thickness of the cap 62. The application of a force, for example a pressure exerted by a finger, on this breakable portion causes breakage thereof and creates an opening for the passage of a connector, for example an antenna connector.

Rail

The rail 10 comprises a base 20 and a backplane bus 40.

The base 20 is intended to receive, on the one hand, the backplane bus 40 and, on the other hand, modules 50.

The backplane bus 40 is intended to establish the connection between the different modules 50 installed on the rail 10.

The backplane bus 40 may be removable from the base 20.

The backplane bus 40 is shown, as illustrated in FIG. 14, in the form of a plate-shaped support. The backplane bus 40 has an elongated shape according to the axis X.

The backplane bus 40 comprises, on one face, called upper face 41, a plurality of rows of female connectors 42 and a set of conductive tracks 43 connecting together in particular the different female connectors 42. Each row of female connectors 42 is intended to cooperate with a row of male connectors 81 of an electronic board 80 of a module 50.

The rows of female connectors 42 are arranged on the backplane bus 40 such that, when the backplane bus 40 is in place in the base 20, each slot 11 of the rail 10 comprises one or two row(s) of female connectors 42.

In one aspect, the female connectors 42 are in the form of a bare copper pad.

Preferably, the backplane bus 40 comprises, at longitudinal ends 44, a connector, so-called the end connector 46, intended to cooperate, indirectly, with another end connector 46 of another rail.

The base 20, as illustrated in FIGS. 12 and 13, has an elongated shape according to the axis X.

Preferably, the base 20 is symmetrical with respect to a lateral midplane YZ of the rail.

Preferably, the base 20 is made of a rigid material, for example of Polycarbonate/Acrylonitrile Butadiene Styrene (acronym: PC/ABS).

Preferably, the base 20 is made by injection moulding.

In a preferred version, the base 20 has a substantially U-like shape, in cross-section, in a plane YZ.

The base 20 comprises a longitudinal web, called the web 21, and two longitudinal flanges, so-called the first flange 22 and the second flange 23. The two flanges 22, 23 are arranged on either side of the web 21.

Preferably, each of the two flanges 22, 23 extends substantially vertically from a face, so-called the upper face 211, of the web 21.

Each of the two flanges 21, 22 has an inner longitudinal face, on the side of the web, forming a longitudinal rim, so-called the first rim 221, 222.

Advantageously, the first rims 221, 222 contribute to guiding and holding the modules 50 in the base 20.

The base 20 comprises a longitudinal groove 24. This longitudinal groove 24 is formed in the web 21.

Preferably, the longitudinal groove 24 is symmetrical with respect to the longitudinal midplane XY of the rail 10.

Advantageously, the longitudinal groove 24 forms a slide for receiving the backplane bus 40. Thus, the backplane bus 40 is inserted into the longitudinal groove 24 by sliding from a longitudinal end 29 of the base 20.

Preferably, the longitudinal groove 24 extends over the entire length of the base 20. Thus, the backplane bus 40 is inserted into the longitudinal groove 24 of the base 20 by sliding indifferently from one of the two longitudinal ends 29 of the base 20.

Said longitudinal groove has a thickness substantially equal to the thickness of the backplane bus 40, i.e. to the thickness of the plate-shaped support, so that, when the backplane bus 40 is in position in the longitudinal groove 24 of the base 20, the upper face 41 of the backplane bus 40 is flush with the upper face 211 of the web 21.

Thus, the upper face 41 of the backplane bus 40 and the upper face 211 of the web 21 advantageously forms a plane for receiving the modules 50.

Said longitudinal groove has a width, according to the axis Y, substantially equal to the width of the backplane bus 40, with some clearance, so as to enable the insertion of the backplane bus 40 into the longitudinal groove 24 without forcing.

In one aspect, the longitudinal groove 24 may comprise protuberances 241 which extend from longitudinal edges 242 of said longitudinal groove, dimensioned so as to compensate for the clearance in said longitudinal groove, centring and holding the backplane bus 40 in the longitudinal groove without forcing it in position. Preferably, said protuberances 241 are arranged at regular intervals at each longitudinal edge 242, according to a symmetrical arrangement with respect to the longitudinal midplane XY.

The base 20 comprises a plurality of first cavities 25. Each first cavity 25 is configured to receive a retaining member 617 of a module 50.

Preferably, the first cavities 25 are arranged substantially at the intersection between the web 21 and the first rim 221 of the first flange 22.

Preferably, the first cavities 25 are distributed over the length of the base 20 and arranged at regular intervals.

The first cavities 25 are arranged such that each slot 11 of the rail 10 comprises one first cavity 25. Preferably, each first cavity 25 is centred in the slot 11.

Preferably, each first cavity 25 is dimensioned so as to receive only one single retaining member 617 of a module 50.

In one aspect, each first cavity 25 is bevelled at the web 21 to accompany and facilitate the insertion of the retaining member 617 of the module 50.

In one aspect, the first cavities 25 are preferably through, as illustrated in FIGS. 12, 13.

The base 20 comprises a plurality of second cavities 26. Each second cavity 26 is configured to receive at least one hook 75 of the lever 70 of the locking member of a module 50.

Preferably, the second cavities 26 are arranged substantially at the intersection between the web 21 and the first rim 231 of the second flange 23.

Preferably, the second cavities 26 are distributed over the length of the base 20 and arranged at regular intervals.

Each second cavity 26 is dimensioned so as to receive two hooks 75 of two levers 70 of two contiguous modules 50.

The second cavities 26 are arranged astride two adjacent slots 11, such that each slot 11 of the rail 10 comprises a portion of a second cavity 26. In other words, the second cavities 26 are arranged in a staggered manner, with respect to the first cavities 25.

In one aspect, each second cavity 26 is bevelled at the level of the web 21 to accompany and facilitate the insertion of the at least one hook 75 of the lever 70 of the locking member.

In one aspect, the second cavities 26 are preferably through, as illustrated in FIGS. 12, 13.

In one aspect, the base 20 comprises a plurality of fastening holes 30 to advantageously enable the passage of fastening elements, such as for example screws, intended to hold the rail 10 to a support, in a secure manner.

Preferably, the fastening holes 30 are formed at the web 21.

In the preferred example of FIG. 12, but without limitation, the fastening holes 30 are arranged on either side of the longitudinal groove 24, at regular intervals along said longitudinal groove. Preferably, said fastening holes 30 are arranged according to a symmetrical arrangement with respect to the longitudinal midplane XY of the rail.

In one aspect, the base 20 comprises a longitudinal flute 243 in the longitudinal groove 24. Preferably, the longitudinal flute 243 is formed over the entire length of the longitudinal groove 24 of the base 20. This longitudinal flute 243 is a so-called reservation flute for advantageously receiving, where necessary, electronic components which would extend from a lower face 47, a face opposite to the upper face 41, of the backplane bus 40.

In one aspect, the base 20 comprises, in the longitudinal groove 24, at least one keying element 31, preferably a plurality of keying elements. Advantageously, the at least one keying element 31 is intended to ensure that the backplane bus 40 is inserted and positioned in the base 20 in the proper direction.

For example, the at least one keying element 31 is in the form of a positioning pin.

Each keying element projects from a bottom of the longitudinal groove 24. Each keying element 31 is intended to cooperate with a complementary orifice 45 formed in all or part of the thickness of the backplane bus 40, when the backplane bus 11 is in the proper position in the longitudinal groove 24 of the base 20.

In the case where there are several keying elements 31, these are arranged non-symmetrically with respect to the longitudinal midplane XY of the rail.

The at least one keying element 31 may also be intended to centre and hold the backplane bus 40 in the longitudinal groove 24, whether complementarily with the protuberances 241 of the longitudinal groove 24 or not.

In the example of FIG. 12, four keying elements 31 are shown.

In one aspect, to prevent the removal of the backplane bus 40 from the longitudinal groove 24 of the base according to the axis Z of the rail, said base comprises, at its longitudinal ends 29, a bulge 28, passing through according to the axis X, dimensioned, with some clearance, so as to enable the passage of the backplane bus 40 and its end connectors 46. When the backplane bus 40 is in position in the longitudinal groove 24 of the base 20, each bulge 28 covers an end connector 46 of the backplane bus 40. Advantageously, the bulges 28 also allow protecting said end connectors 46.

In one aspect, to protect an end connector 46 of the backplane bus 40 from any external mechanical aggressions, when said end connector is not used, the rail 10 comprises a lateral lid 12, as illustrated in FIGS. 1 and 15, intended to cooperate with a bulge 28 of the base 20. Preferably, said lateral lid is able to be fitted into the bulge 28, by clipping.

In one aspect, the rail 10 comprises clipping elements 14, preferably at an outer longitudinal face 222 of the first flange 22 of the base 20.

The outer longitudinal face 222 of the first flange 22 of the base 20 is the face opposite to the inner longitudinal face of the first flange of the base, that one forming the first rim 221.

Said clipping elements of the rail 10 are configured and positioned to cooperate with the clipping elements of another similar rail 10.

When the clipping elements 14 of each rail 10 cooperate, the two rails 10 are longitudinally contiguous, at the first flanges 22 of the base 20 of each. The two rails 10 are parallel to each other according to the axis X.

When they cooperate, such clipping elements 14 allow holding a rail 10 in position with respect to the other.

In one aspect, as illustrated in FIG. 1, the assembly 1 may comprise another electronic module, called two-rail module 50'. The two-rail module 50' has the same features as the above-described module 50 with the difference that the two-rail module 50' is dimensioned, in width, so as to be positioned in two slots 11 of two rails 10 longitudinally contiguous, one slot per rail.

Thus, the bottom of such a two-rail module 50' is dimensioned and configured so as to conform to the shape of the slots 11 of the two rails, and comprises in particular a step 51' to allow overlapping the two contiguous first flanges 22 of the bases 20 of each rail 10.

In particular, among the non-exhaustive common features, the two-rail module 50' comprises a case comprising a bottom and a cap, the bottom comprising a retaining member projecting outwardly of said case. The two-rail module 50' comprises an electronic board accommodated in the case, comprising a connection pin formed of a row of male connectors which extend out of the case via a through aperture formed in the bottom of the case. The two-rail module 50' comprises a locking member 7 comprising a lever mounted free to rotate relative to the bottom, said lever comprising two hooks at a proximal portion.

The two-rail module 50' also declines into a simple, double or triple two-rail module, such as for the module 50.

The two-rail module 50' also declines into a horizontal or vertical two-rail module, like for the module 50.

Thus, in the example of FIG. 1, a simple vertical two-rail module 50' is shown.

Like the modules 50, the two-rail modules 50' have reduced dimensions compared to existing modules and have the advantage, in particular, of being able to be used in restricted spaces.

In one aspect, illustrated in FIGS. 12, 13, the base 20 comprises a plurality of third cavities 27. Each third cavity 27 is configured to receive a retaining member (not shown in the figures) of a two-rail module 50'.

Preferably, the third cavities 27 are arranged substantially at the intersection between the web 21 and the first rim 231 of the second flange 23.

These third cavities 27 are used only in a configuration in which two rails 10 are longitudinally contiguous and a two-rail module 50' is arranged on said two rails. In this configuration, a two-rail module 50' is held on the two rails 10, via on the one hand, the third cavities 27 of a rail 10, and, on the other hand, the second cavities 26 of the other rail 10.

Preferably, the third cavities 27 are distributed over the length of the base 20 and arranged at regular intervals.

The third cavities 27 are arranged at regular intervals, between two consecutive second cavities 26.

The third cavities 27 are arranged such that each slot 11 of the rail 10 comprises a third cavity 27. Preferably, the third cavities 27 are arranged, with respect to the longitudinal midplane XY of the rail, symmetrically to the first cavities 25.

Preferably, each third cavity 27 is dimensioned so as to receive only one single retaining member of a two-rail module 50'.

In one aspect, each third cavity 27 is bevelled at the level of the web 21 to facilitate the insertion of said retaining member.

In one aspect, the third cavities 27 are preferably through, as illustrated in FIGS. 12 and 13.

When a two-rail module is in the operative position in one slot of each rail:

the bottom of said two-rail module is positioned opposite the two rails, the retaining member of the bottom of said two-rail module is engaged in the third cavity of the base of a rail, each hook of the lever of the locking member of the two-rail module is engaged in a second cavity of the base of the other rail, the row of male connectors of the electronic board of the two-rail module is in contact with the row of female connectors of one of the two rails.

In one aspect, to protect the backplane bus 40 in a rail 10 when a slot 11 is not used by a module 50, the rail 10 comprises a protective cover 13, as illustrated in FIG. 1. The protective cover 13 is dimensioned so as to cover the web 21 of the base 20 and the backplane 40, at a free slot 11.

In one aspect, the protective cover 13 is intended to be inserted into the first cavity 25 and the second cavities 26 of said slot.

In another aspect, when the base 20 comprises third cavities 27, the protective cover 13 is intended to be inserted into the first cavity 25 and the third cavity 27 of said slot.

In one aspect, the base 20, preferably the web 21, comprises, at each slot 11 of the rail 10, a hole 32 for receiving an orientation lug 618 of a module 50.

The base 20 having a symmetry according to the longitudinal midplane XY of the rail, and the module 50 being dimensioned so that the bottom 61 of the case 60 has a shape complementary to the shape of the rail 10, at least at one slot 11 when the base 20 comprises first cavities 25 and third cavities 27 configured to receive, each, a retaining member 617 of the bottom 61 of the case 60, the module 50 may be positioned, before locking thereof, in the wrong direction in its slot 11.

When a module 50 is inserted in the proper direction into a slot 11 of the rail, the orientation lug 618 of the module cooperates with the associated receiving hole 32 of the base 20.

When a module 50 is inserted in the wrong direction into a slot 11 of the rail 10, the orientation lug 318 of the module 50 does not cooperate with any receiving hole 32 of the base 20, and advantageously allows avoiding contact between a row of male connectors 80 of the electronic board 80 of the module 50 and a row of female connectors 42 of the backplane bus 40 and creating a short-circuit potential, if the backplane bus 40 is powered.

In one aspect, to assemble two rails 10, the assembly 100 comprises a union connector 90, 91.

In one aspect, the union connector is a straight union connector 90. Advantageously, such a straight union connector 90 allows mechanically and electrically assembling two rails 10 end-to-end, i.e. longitudinally, by linking the longitudinal ends 29 of the base 20. The axes X of each rail 10 are then coincident.

The straight union coupling 90 is in the form of a straight part which has, at each of its ends, a shape complementary to the shape of the longitudinal end 29 of the base 20 of a rail. Preferably, the straight part is able to be nested, by clipping, in the bulge 28 of the base 20 of each of the two rails 10 to be assembled.

Said straight union connector comprises a so-called connecting electronic board arranged in the straight part. The connecting electronic board comprises, at each end of the straight union connector, an end connector configured to cooperate with an end connector 46 of the backplane bus 40 of a rail.

In another aspect, the union connector is a U-shaped union connector 91. Advantageously, such a union connector allows mechanically and electrically assembling two rails longitudinally contiguous, i.e. parallel. Said union connector 91 is in the form of a U-shaped part, which has at each of its ends a shape complementary to the shape of the longitudinal end 29 of the base 20 of a rail. Preferably, said part is able to be nested, by clipping, in the bulge 28 of the base 20 of each of the two rails to be assembled. Said union connector 91 comprises a so-called connecting electronic board arranged in the U-shaped part. The electronic board comprises, at each end of said union coupling 91, an end connector configured to cooperate with an end connector 46 of the backplane bus 40 of a rail.

Example of Assembly of a Module 50

In a first step, the electronic board 80 is arranged in the bottom 61 of the case 60, positioned on the bearing surfaces 644 of the shoulders 643 of the bottom 61.

When the shoulders 643 of the bottom 61 are provided with a spike 645, each spike 645 is inserted into the through orifices 84 formed in the thickness of the electronic board 80.

In a second step, the lever 70 of the locking member is mounted on the bottom 61.

The lever 70 of the locking member is positioned with respect to the bottom 61 so that the radial excrescence 743 of each mounting pin 742 of the lever 70 faces the complementary recess 616 of the associated orifice 615 of the bottom 61, then is slightly forcibly inserted into said orifices of said bottom.

The order of implementation of these two steps is not imposed and may be carried out in the reverse order described without modifying the result of said steps.

In a final step, the cap 62 is assembled at the bottom 61 by clipping. A rotation of the lever 70 of the locking member about its axis of rotation X1 is necessary to clear access to the bottom 61 and enable the assembly of the cap 62 and of the bottom 61.

When the cap 62 and the bottom 61 are assembled, the electronic board 80 is sandwiched between the bearing surfaces 642 of the shoulders 641 of said cap 62 and the bearing surfaces 644 of the shoulders 643 of said bottom 61.

Example of Mounting of a Simple Module 50a, Whether it is Horizontal or Vertical, on a Rail 10

The simple module 50a is dimensioned so as to be mounted in one slot 11 of the rail. Preferably, the simple module 50a comprises one retaining member 617. Preferably, the simple module 50a comprises an orientation stud 618. The simple module 50a may comprise one or two connection pin(s) on its electronic board 80.

In a first step, the simple module 50a is positioned in the rail 10.

The lever 70 of the locking member of the simple module 50a is placed in an unlocked position. Then, the simple module 50a is positioned on the rail 10 by inserting the retaining member 617 of the bottom 61 of the case 60 into the first cavity 25 of the selected slot 11 on the rail 10. The orientation lug 618 of the module 50 cooperates with the associated receiving hole 32 of the base 20.

Once the simple module 50a has been positioned, the bottom 61, and more particularly the inner face 613 of the bottom 61, is opposite the base 20 of the rail 10. The inner face 613 of the bottom 61 is arranged against the receiving plane formed by the upper face 41 of the backplane bus 40 and the upper face 211 of the web 21. The orientation lug 618 of the module cooperates with the receiving hole 32 of the base, at the slot.

In a second step, the module 50a is locked to the rail. The lever 70 of the locking member of the simple module 50a is actuated, by a rotation about its axis of rotation X1, up to the locked position. Each hook 75 of the locking lever is engaged respectively in a second cavity 26 of the base, at the slot 11. The contact between the module 50 and the backplane bus 40 is established, via the contact between the row of male connectors 81 of a connection pin of the electronic board 80 of the module 50 and the row of female connectors 42 of the backplane bus 40. In the case where the electronic board comprises two connection pins each comprising a row of male connectors 81, each row of male connectors is in contact with a row of female connectors of the backplane bus 40.

The simple module 50a is then in the operative position and fixedly held to the rail 10. The simple module 50a is fixedly held to the rail, as illustrated in FIG. 16, on the one hand via the retaining member 617 and on the other hand by the hooks 75 of the lever 70.

The simple module 50a is easily mounted on the rail, and locked to said rail, without using a particular tool.

Afterwards, another module 50 may be mounted on the rail, in a slot adjacent to that one receiving the first module or at a remote slot.

Example of Mounting of a Double Module 50b, Whether it is Horizontal or Vertical, on a Rail 10

The double module 50b is dimensioned so as to be mounted in two adjacent slots 11 of the rail, so-called first and second slots. The double module 50b may comprise one or two retaining member(s), preferably two retaining members 617. The double module 50b may comprise one or two orientation lug(s) 618, preferably two orientation lugs. The double module 50b may comprise one or two connection pin(s) on its electronic board 80.

In a first step, the double module 50b is positioned in the rail 10.

The lever 70 of the locking member of the double module 50b is placed in an unlocked position. Then, the double module 50b is positioned on the rail 10 by inserting a retaining member 617 of the bottom 61 of the case 60 in the first cavity 25 of one of the two slots 11 selected on the rail 10. When the double module 50b comprises two retaining members, a retaining member is inserted into the first cavity of the base, at the first slot, and the other retaining member is inserted into the first cavity of the base, at the second slot.

Once the double module 50b has been positioned, the bottom 61, and more particularly the inner face 613 of the bottom 61, is opposite the base 20 of the rail 10. The inner face 613 of the bottom 61 is arranged against the receiving plane formed by the upper face 41 of the backplane bus 40 and the upper face 211 of the web 21. The orientation lug 618 of the module 50 cooperates with the associated receiving hole 32 of the base 20 of a slot. When the double module 50b comprises two orientation lugs, an orientation lug cooperates respectively with the receiving hole of the base, at the first slot, and the other orientation lug cooperates respectively with the receiving hole of the base, at the second slot.

In a second step, the module 50a is locked to the rail. The lever 70 of the locking member of the double module 50b is actuated, by a rotation about its axis of rotation X1, up to the locked position. One of the hooks 75 of the locking lever is engaged in a second cavity 26 of the base, at the first slot 11. The other hook 75 of the locking lever is engaged in a second cavity of the base, at the second slot. The contact between the module 50 and the backplane bus 40 is established, via the contact between the row of male connectors 81 of a connection pin of the electronic board 80 of the module 50 and the row of female connectors 42 of the backplane bus 40. In the case where the electronic board comprises two connection pins each comprising a row of male connectors 81, a row of male connectors is in contact with a row of female connectors of the backplane bus 40, at the first slot, and the other row of male connectors is in contact with a row of female connectors of the backplane bus 40, at the second slot.

The double module 50b is then in the operative position and fixedly held to the rail 10. The double module 50b is fixedly held to the rail, as illustrated in FIG. 16, on the one hand via the retaining member 617 and on the other hand by the hooks 75 of the lever 70.

The double module 50b is easily mounted on the rail, and locked to said rail, without using a particular tool.

Afterwards, another module 50 may be mounted on the rail, in a slot adjacent to that one receiving the first module or at a remote slot.

Example of Mounting of a Triple Module 50c, Whether it is Horizontal or Vertical, on a Rail 10

The triple module 50c is dimensioned so as to be mounted in three adjacent slots 11 of the rail, called first, second and third slots. The triple module 50c may comprise one, two or three retaining member(s), preferably two retaining members 617. The triple module 50c may comprise one, two or three orientation lug(s) 618, preferably one orientation lug. The triple module 50c may comprise one or two connection pin(s) on its electronic board 80.

In a first step, the triple module 50c is positioned in the rail 10.

The lever 70 of the locking member of the triple module 50c is placed in an unlocked position. Then, the triple module 50c is positioned on the rail 10 by inserting a retaining member 617 of the bottom 61 of the case 60 in the first cavity 25 of one of the three slots 11 selected on the rail 10. When the triple module 50c comprises two retaining members, one retaining member is inserted into the first cavity of the base, at the first slot, and the other retaining member is inserted into the first cavity of the base, at the third slot. When the triple module 50c comprises three retaining members, one retaining member is inserted into the first cavity of the base, at the first slot, another retaining member is inserted into the first cavity of the base, at the second slot and the last retaining member is inserted into the first cavity of the base, at the third slot.

Once the triple module 50c is positioned, the bottom 61, and more particularly the inner face 613 of the bottom 61, is opposite the base 20 of the rail 10. The inner face 613 of the bottom 61 is arranged against the receiving plane formed by the upper face 41 of the backplane bus 40 and the upper face 211 of the web 21. The orientation lug 618 of the module 50 cooperates with the associated receiving hole 32 of the base 20 of a slot. When the triple module 50c comprises two orientation lugs, one orientation lug cooperates respectively with the receiving hole of the base, at one of the three slots, and the other orientation lug cooperates respectively with the receiving hole of the base, at another one of the two remaining slots.

In a second step, the module 50a is locked to the rail. The lever 70 of the locking member of the triple module 50c is actuated, by a rotation about its axis of rotation X1, up to the locked position. One of the hooks 75 of the locking lever is engaged in a second cavity 26 of the base, at the first slot. The other hook 75 of the locking lever is engaged in a second cavity of the base, at the third slot. The contact between the module 50 and the backplane bus 40 is established, via the contact between the row of male connectors 81 of a connection pin of the electronic board 80 of the module 50 and the row of female connectors 42 of the backplane bus 40. In the case where the electronic board comprises two connection pins each comprising a row of male connectors 81, a row of male connectors is in contact with a row of female connectors of the backplane bus 40, at the first slot, and the other row of male connectors is in contact with a row of female connectors of the backplane bus 40, at the third slot.

The triple module 50c is then in the operative position and fixedly held to the rail 10. The triple module 50c is fixedly held to the rail, as illustrated in FIG. 16, on the one hand via the retaining member 617 and on the other hand by the hooks 75 of the lever 70.

The triple module 50c is easily mounted on the rail, and locked to said rail, without using a particular tool.

Afterwards, another module 50 may be mounted on the rail, in a slot adjacent to that one receiving the first module or at a remote slot.

Example of Mounting of a Simple Two-Rail Module 50', Whether Horizontal or Vertical, on Two Rails 10 Attached Longitudinally.

The two rails are so-called first rail and second rail. The simple two-rail module 50' is dimensioned so as to be mounted in a slot 11 of each rail, called first and second slots. The first slot is on the first rail and the second slot is on the second rail.

The simple two-rail module 50' comprises one retaining member. The simple two-rail module 50' comprises an orientation lug 618. The simple two-rail module 50' may comprise one or two connection pin(s) on its electronic board 80.

In a first step, the simple two-rail module 50' is positioned in the two rails 10.

The lever 70 of the locking member of the simple two-rail module 50' is placed in an unlocked position. Then, the simple two-rail module 50' is positioned on the two rails 10 by inserting the retaining member 617 of the bottom 61 of the case 60 in the first cavity 25 of the second slot 11 on the second rail 10.

Once the simple two-rail module 50' is positioned, the bottom 61, and more particularly the inner face 613 of the bottom 61, is opposite the base 20 of each rail 10. The orientation lug 618 of the simple two-rail module 50' cooperates with the associated receiving hole 32 of the base 20 of the first slot or of the second slot.

In a second step, the two-rail module is locked to the rail. The lever 70 of the locking member of the two-rail module is actuated, by a rotation about its axis of rotation X1, up to the locked position. One of the hooks 75 of the locking lever is engaged in a second cavity 26 of the base, at the first slot 11. The other hook 75 of the locking lever is engaged in the other second cavity of the base, at the first slot of the first rail. The contact between the module 50 and the backplane bus 40 is established, via the contact between the row of male connectors 81 of a connection pin of the electronic board 80 of the module 50 and the row of female connectors 42 of the backplane bus 40. In the case where the electronic board comprises two connection pins each comprising a row of male connectors 81:

a row of male connectors is in contact with a row of female connectors of the backplane bus 40, at the first slot, and the other row of male connectors is in contact with a row of female connectors of the backplane bus 40, at the second slot, or each row of male connectors is in contact with a row of female connectors of the backplane bus 40, at the first or second slot.

The simple two-rail module 50' is then in the operative position and fixedly held to the rail 10. The simple two-rail module 50' is fixedly held to the rail, as illustrated in FIG. 16, on the one hand via the retaining member 617 and on the other hand by the hooks 75 of the lever 70.

The simple two-rail module 50' is easily mounted on the rail, and locked to said rail, without using a particular tool.

A double or triple two-rail module is mounted in a similar manner to the double or triple one-rail module, but arranged on two parallel rails.

What is claimed is:

1. A modular electronic assembly, comprising:
a rail comprising a base, elongated according to an axis X, accommodating an electronic board referred to as a backplane bus, elongated according to the axis X, said rail defining a plurality of slots aligned according to said axis X,
the base comprising, at each slot, on the one hand a first cavity and, on the other hand, two second cavities,
the backplane bus comprising, at each slot, a row of female connectors,
a plurality of electronic modules, called modules,
each module being configured to be mounted in at least one slot of the rail and to be fixedly and reversibly held therein in a so-called operative position, each module comprising:
a case comprising a bottom and a cap, the bottom comprising at least one retaining member projecting outwardly of said case,
an electronic board accommodated in the case, comprising at least one connection pin formed by a row of male connectors which extend out of the case via a through aperture formed in the bottom of the case,
a locking member comprising a lever rotatably coupled to the case and configured so as to be free to rotate relative to the bottom, said lever comprising two hooks at a proximal portion,
the modular electronic assembly being such that:
when a module is mounted in a slot of the rail and fixed in the operative position:
the bottom of said module is positioned opposite the rail,
a retaining member of the bottom of said module is engaged in the first cavity of the base,
each hook of the lever of the locking member of said module is engaged respectively in a second cavity of the base,
the row of male connectors of a connection pin of the electronic board of said module is in contact with the row of female connectors, or
when a module is mounted in at least two adjacent slots of the rail and fixed in an operative position:
the bottom of said module is positioned opposite the rail,
a retaining member of the bottom of said module is engaged in the first cavity of the base at one of the at least two slots,
one of the hooks of the lever of the locking member of said module is engaged in a second cavity of the base at one of the at least two slots, and the other hook is engaged in a second cavity of the base at another one of the at least two slots,
the row of male connectors of a connection pin of the electronic board of said module is in contact with a row of female connectors, at one of the at least two slots.

2. The modular electronic assembly according to claim 1, wherein each second cavity is arranged astride two adjacent neighboring slots of the rail, dimensioned so as to receive two hooks of two modules each arranged in one of said two slots.

3. The modular electronic assembly according to claim 1, wherein: at each slot of the rail, the base comprises a receiving hole, the bottom of the case of a module comprises an orientation lug, the modular electronic assembly being such that when the module is mounted in at least one slot of the rail and fixed in an operative position, the orientation lug cooperates with a receiving hole of the base, at a slot of the rail.

4. The modular electronic assembly according to claim 1, wherein the case of a module comprises elements for holding the electronic board in position in the case.

5. The modular electronic assembly according to claim 1, wherein the case of a module comprises a through opening formed in the cap for the passage of a secondary connector arranged on the electronic board of the module.

6. The modular electronic assembly according to claim 1, wherein the rail comprises clipping elements intended to cooperate with clipping elements of another rail.

7. The modular electronic assembly according to claim 1, comprising two rails and a union connector for mechanically and electrically assembling said two rails.

8. The modular electronic assembly according to claim 1, comprising two rails and a dual-rail electronic module, said dual-rail electronic module being configured, when the two rails are longitudinally attached, to be mounted in at least one slot of each rail and to be fixedly and reversibly held therein in an operative position.

9. A rail for a modular electronic assembly according to claim 1.

10. An electronic module for a modular electronic assembly according to claim 1.

\* \* \* \* \*